United States Patent
Fietzek et al.

(10) Patent No.: US 11,858,810 B2
(45) Date of Patent: Jan. 2, 2024

(54) OZONE GENERATOR WITH HEAT PIPE COOLING

(71) Applicant: Xylem Europe GmbH, Schaffhausen (CH)

(72) Inventors: Reiner Fietzek, Herford (DE); Nicole Brueggemann, Lage (DE); Ralf Fiekens, Schloß Holte-Stukenbrock (DE); Manfred Salvermoser, Herford (DE)

(73) Assignee: Xylem Europe GmbH, Schaffhausen (CH)

( * ) Notice: Subject to any disclaimer, the term of this patent is extended or adjusted under 35 U.S.C. 154(b) by 48 days.

(21) Appl. No.: 16/965,440

(22) PCT Filed: Jan. 25, 2019

(86) PCT No.: PCT/EP2019/051861
§ 371 (c)(1),
(2) Date: Jul. 28, 2020

(87) PCT Pub. No.: WO2019/145478
PCT Pub. Date: Aug. 1, 2019

(65) Prior Publication Data
US 2021/0053825 A1   Feb. 25, 2021

(30) Foreign Application Priority Data
Jan. 29, 2018 (EP) .................... 18153888

(51) Int. Cl.
C01B 13/11 (2006.01)
H01T 23/00 (2006.01)
H05K 7/20 (2006.01)

(52) U.S. Cl.
CPC ............ C01B 13/115 (2013.01); H01T 23/00 (2013.01); H05K 7/20336 (2013.01);
(Continued)

(58) Field of Classification Search
CPC ............... C01B 13/115; C01B 2201/14; C01B 2201/22; C01B 2201/32; C01B 2201/64;
(Continued)

(56) References Cited

U.S. PATENT DOCUMENTS 5,437,843 A * 8/1995 Kuan ..................... C01B 13/11
                                                422/907
6,027,701 A * 2/2000 Ishioka .................. C01B 13/11
                                                204/176
(Continued)

FOREIGN PATENT DOCUMENTS

| EP | 0160964 A2 | 11/1985 |
| JP | 07187609 A | 7/1995 |
| JP | 2001210448 A | 8/2001 |

OTHER PUBLICATIONS

International Search Report and Written Opinion for International Application No. PCT/EP2019/051861, dated Mar. 8, 2019, 8 pages.
(Continued)

*Primary Examiner* — Xiuyu Tai
(74) *Attorney, Agent, or Firm* — RatnerPrestia

(57) ABSTRACT

A device for generating ozone from oxygen-containing gas by silent electric discharge, the device including an electrode arrangement having at least one high-voltage electrode and at least one annular ground electrode. An annular dielectric is arranged between the at least one high-voltage electrode and the at least one ground electrode. The at least one high-voltage electrode is surrounded by at least one annular heat pipe.

19 Claims, 3 Drawing Sheets

(52) U.S. Cl.
CPC ...... *C01B 2201/14* (2013.01); *C01B 2201/22* (2013.01); *C01B 2201/32* (2013.01); *C01B 2201/64* (2013.01); *C01B 2201/72* (2013.01)

(58) Field of Classification Search
CPC . C01B 2201/72; C01B 13/11; C01B 2201/76; C01B 2201/90; H01T 23/00; H01T 19/00; H05K 7/20336; B01J 19/08; B01J 19/088; C25B 9/17; C25B 11/02; C25B 1/13
See application file for complete search history.

(56) References Cited

U.S. PATENT DOCUMENTS

| | | | |
|---|---|---|---|
| 2009/0008252 A1 | 1/2009 | Ifland | |
| 2013/0330243 A1* | 12/2013 | Fietzek | ................. C01B 13/115 422/186.18 |

OTHER PUBLICATIONS

International Preliminary Report on Patentability and Written Opinion for International Application No. PCT/EP2019051861, dated Aug. 4, 2020, 6 pages.

\* cited by examiner

OZONE GENERATOR WITH HEAT PIPE COOLING

CROSS-REFERENCE TO RELATED APPLICATIONS

This patent application is a U.S. National Phase Patent Application of PCT Application No.: PCT/EP2019/051861, filed Jan. 25, 2019, which claims priority to European Patent Application No. EP18153888.5, filed Jan. 29, 2018, each of which is incorporated by reference herein in its entirety.

The present invention relates to a device for generating ozone with the features of the preamble of claim 1.

Ozone is a powerful oxidizing medium for organic as well as for inorganic compounds. There are diverse areas of application for ozone, one of which is its use in water treatment.

Technically, ozone can be generated by silent electrical discharge in an oxygen-containing gas. Silent electrical discharge is, in contrast to spark discharge, to be understood as a stable plasma discharge or corona discharge. Molecular oxygen is dissociated into atomic oxygen. The reactive oxygen atoms subsequently attach themselves to molecular oxygen in an exothermic reaction and form tri-atomic molecules, i.e. ozone. The ozone yield depends inter alia on the electric field strength and operating temperature. The dependence on operating temperature rests on the fact that ozone decomposes more rapidly again into molecular oxygen at higher temperatures and, due to the resulting displacement of the equilibrium between the originating and disintegrating ozone, the available ozone concentration is less.

Electrode assemblies with multiple discharge gaps for ozone generation are known. They offer several advantages over single gap systems, e.g. better utilization of the reactor volume, lower space requirements, lower investment cost, and higher discharge areas. However the main difficulty is a sufficient cooling, which is needed to achieve high ozone concentrations with good efficiency.

To avoid excessive heat build-up, commonly water is arranged to directly cool the outer electrode. However with multiple-gap arrangements, these known cooling systems are too inefficient.

Document JP 2001-210448 discloses a corona discharge device to be used for gas processing device, such as a deodorizer with an electrode arrangement with one gap. A central heat pipe is in airtight contact with an inside of a discharge electrode. The cooling effect is improved by removing the heat generated in the electric discharges by the central rod-shaped heat pipe.

It is an objective of the present invention to provide a device for generating ozone, which is able to remove excessive heat from the at least one discharge gap and from components of the generating device.

This problem is solved by a device for generating ozone with the features listed in claim 1.

Accordingly, a device for generating ozone from oxygen-containing gas with an electrode arrangement with at least one high-voltage electrode and at least one annular ground electrode is provided, wherein between the at least one high-voltage electrode and the at least one ground electrode an annular dielectric is arranged, and the at least one high-voltage electrode is surrounded by at least one annular heat pipe. The at least one high-voltage electrode, the at least one ground electrode and/or an annular dielectric can be designed to be an annular heat pipe.

An annular heat pipe has radially spaced inner and outer walls defining an annular space in cross section. The annular heat pipe allows cooling of the discharge gap or components of the electrode arrangement with high efficiency. In addition a cooling medium and pumping systems are not necessary and the cooling section can be placed in proximity to the discharge gap. The systems are therefore much smaller.

Preferably, the central high-voltage electrode is formed by a metal heat pipe with a circular cross-section. This way, heat can be efficiently transported out of the internal structure. In another preferred embodiment, the central high-voltage electrode is formed by a filler material arranged on a heat pipe with a circular cross-section. This heat pipe can be an insulator. The filler material can be a stainless steel mesh or fabric. This is advantageous in particular in the event of a breakdown, because the electrode arrangement can demonstrate intrinsically safe electrical behaviour since, during the breakdown, the substantially lighter inner electrode, which consists solely of the filler material, can evaporate without damaging the substantially higher-mass outer electrode. The ozone generator can generally remain in operation in spite of the breakdown.

Advantageously, at least one of the annular heat pipes forms an electrode. The electrode is directly cooled and installation space can be further saved.

In one embodiment, at least two discharge gaps are formed, which are traversed by the gas, wherein one of said gaps is formed between the high-voltage electrode and the dielectric and the other gap is formed between said dielectric and the ground electrode. In another embodiment, four discharge gaps are formed, which are traversed by the gas, wherein one high-voltage electrode and one ground electrode are formed each by an annular heat pipe. Multiple discharge gaps for ozone generation offer the above mentioned advantages. By usage of an annular heat pipe, the system can be efficiently cooled even inside.

The annular heat pipes are preferably heat exchange systems with an air-cooled finned condenser. In another preferred embodiment a heat exchanger is arranged within the condensation zone of the annular heat pipe, wherein a cooling jacket of the heat exchanger is directly connected to the heat pipe.

It is advantageous, if each of the at least one annular heat pipes is a closed heat exchange system.

Preferably, ozone is generated from oxygen-containing gas with silent electric discharge.

Preferred embodiments of the present invention will be described with reference to the drawings. In all figures the same reference signs denote the same components or functionally similar components.

Figure 1:
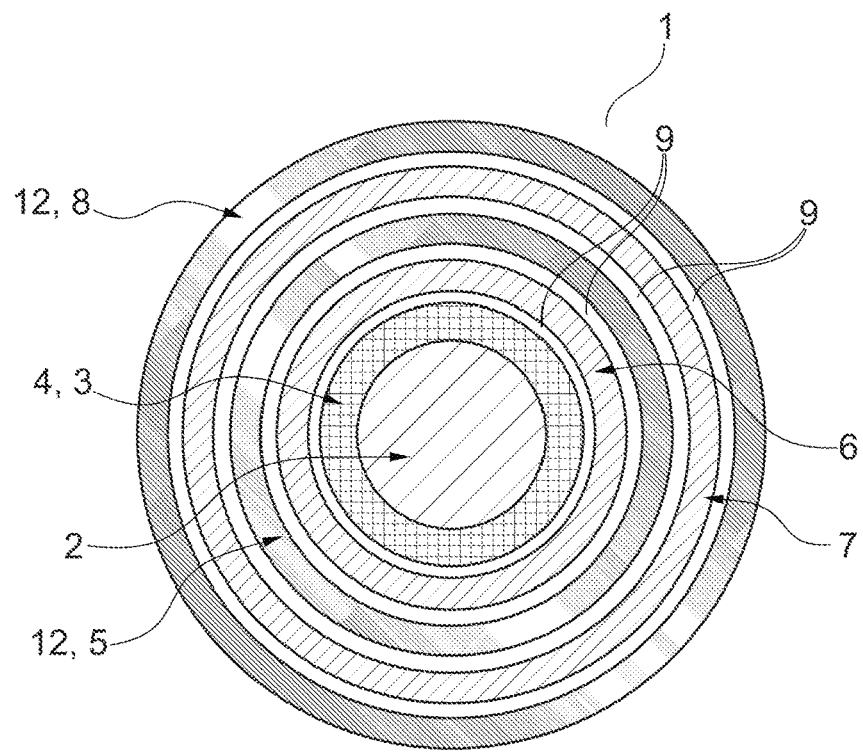
FIG. 1 shows a schematic cross-sectional view of a multi-gap discharge unit of an ozone generator with a central heat pipe made of glass.

FIG. 1 shows an electrode arrangement 1 of a device for generating ozone with a group of annular shaped electrodes and a central heat 2 pipe with a circular cross-section made of glass which are installed in a nesting manner. The isolator 2 (central heat pipe) is surrounded by a stainless steel mesh 3, which forms a high voltage electrode 4. The high voltage electrode 4 is concentrically surrounded by a ground electrode 5, wherein in between the electrodes 4,5 a dielectric 6 is arranged. The ground electrode 5 is again surrounded by a dielectric 7 which is covered by a high voltage electrode 8. Gaps 9 are formed both between the high-voltage electrodes 4,8 and the dielectric 6,7 and between the dielectric 6,7 and the ground electrode 5.

Figure 4:
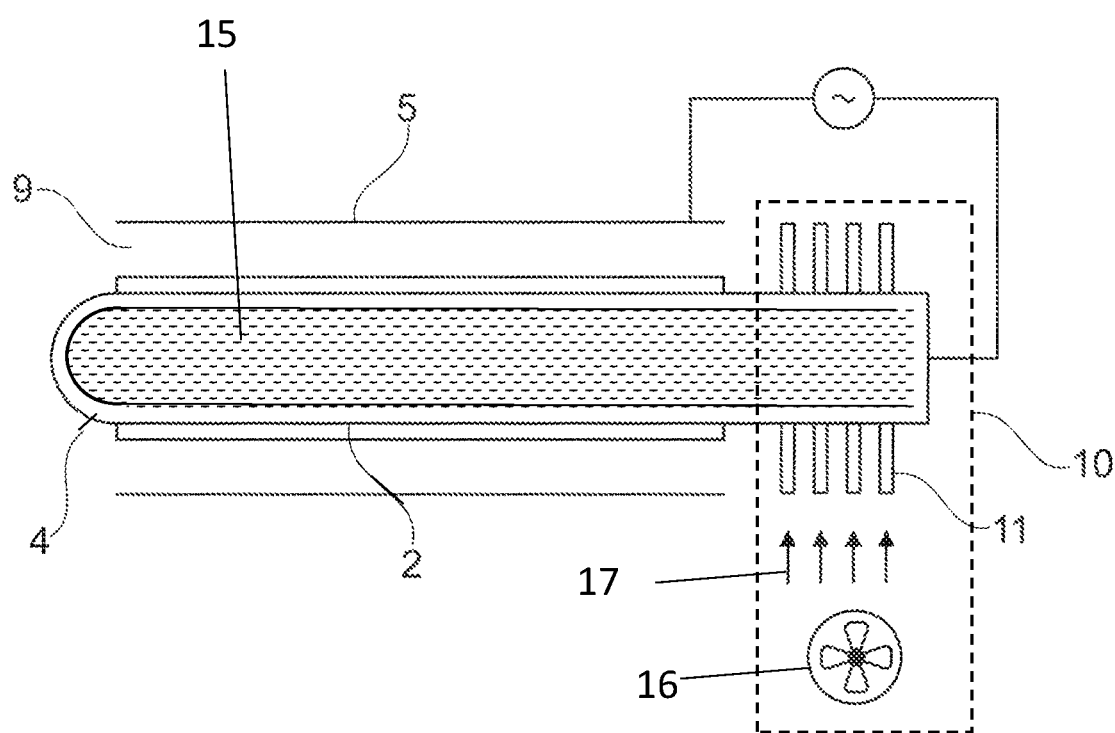
FIG. 4 shows a schematic view of a heat pipe arrangement in a discharge gap.

The central heat pipe 2 is a hollow cylindrical tube filled with a material that will vaporize at operating temperatures of the inner high-voltage electrode. The tube, as shown in FIG. 4, can extend into a bonnet 10 wherein it is provided with some extended surface 11. The extended surface 11 can be realized by helically wound fins, studs, longitudinally organized fins or other known forms of extended surface. In the condensation zone of the heat pipe 2 the tube 2 is cooled by air which is circulated through the bonnet 10. The vaporizing and condensing material typically may be water, or methyl alcohol or ethyl alcohol or ammonia.

Heat pipes are heat transfer devices which provide high heat transport efficiency. Heat pipes have an enclosed cavity (e.g. defined between each of double walls 5A, 5B and 8A, 8B) filled with a condensable heat transfer medium 15. Heat is put into the heat pipe at an evaporator section where the working fluid is vaporized and the vapour travels to a condenser section of the heat pipe where it condenses, thereby giving up heat which is radiated or conducted to an eternal load or sink. The condensed working fluid is then returned to the evaporator section typically be refluxing or through a wick which conducts the liquid by capillary action.

Annular heat pipes 12 with a double wall structure —5A, 5B and 8A, 8B, respectively—form the ground electrode 5 and the outer high-voltage electrode 8. These heat pipes typically may be made of various grades of steel, aluminum alloys or chromium-nickel-iron alloys.

Each heat pipe 2,12 has preferably its own closed heat exchange system.

Figure 2:
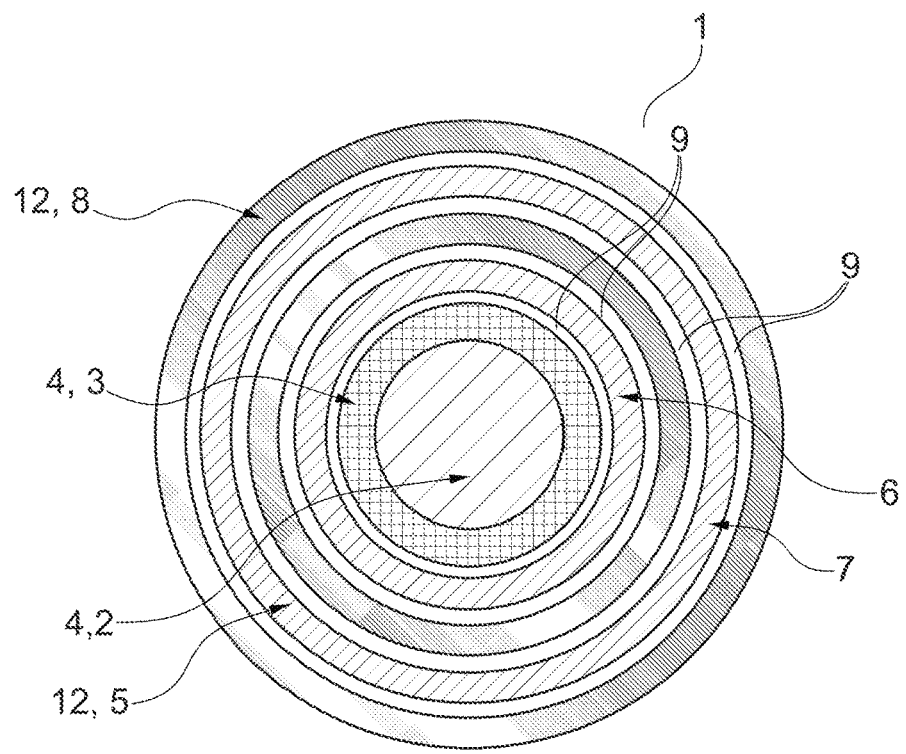
FIG. 2 shows a schematic cross-sectional view of a multi-gap discharge unit of an ozone generator with a central high-voltage electrode formed by a metal heat pipe and a stainless steel wire mesh.

In FIG. 2 the inner high-voltage electrode 4 is formed by the mesh 3 and the central heat pipe 2, which are both made of metal.

Figure 3:
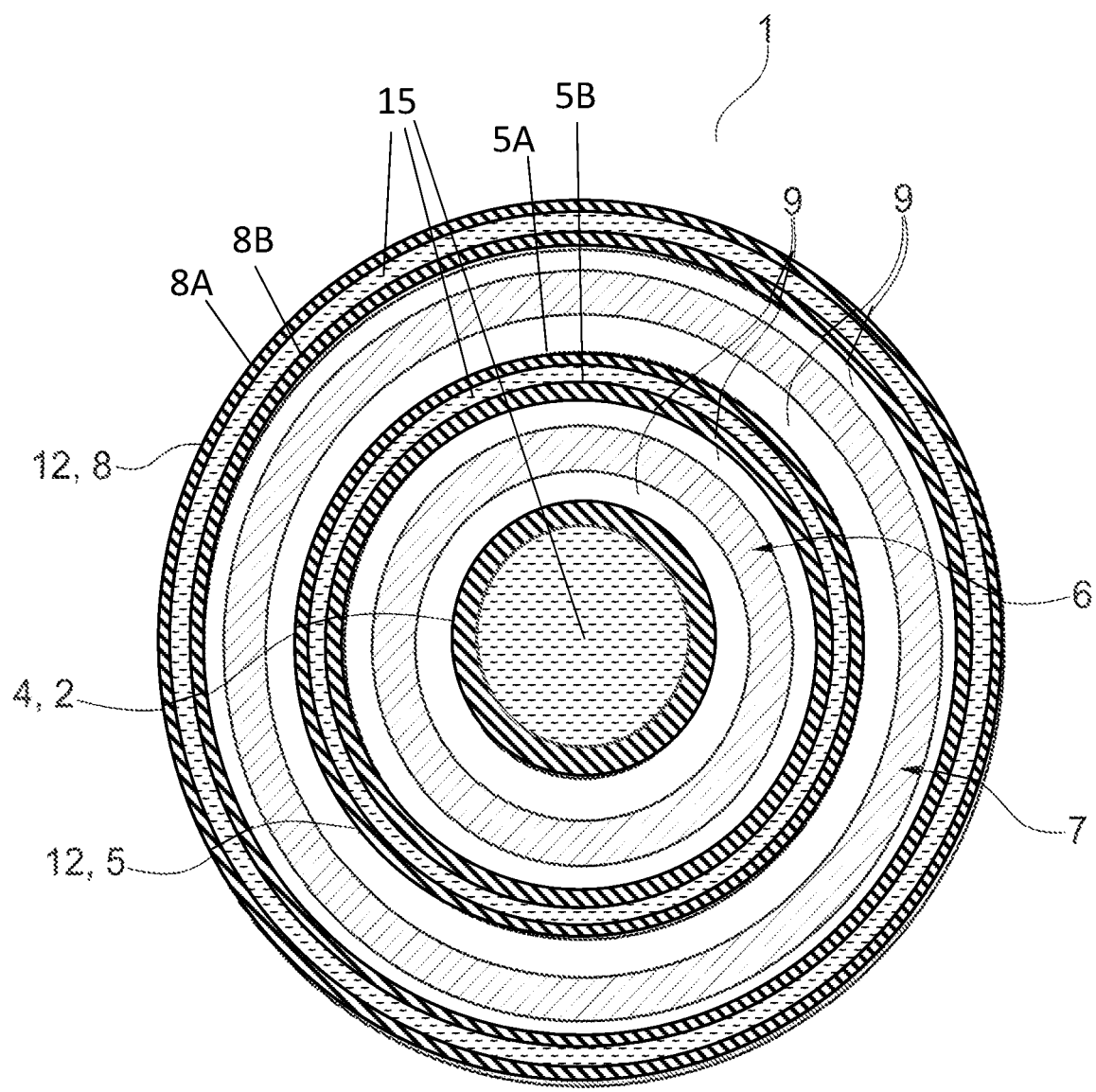
FIG. 3 shows a schematic cross-sectional view of a multi-gap discharge unit of an ozone generator with a central heat pipe functioning as a high-voltage electrode.

In the electrode arrangement of FIG. 3, the central heat pipe 2 solely forms the inner high-voltage electrode 4. A mesh is not provided.

FIG. 4 shows the arrangement of the annular central heat pipe 2 containing heat transfer medium 15, surrounded by a discharge gap 9. The cooling section 10 (i.e. heat exchanger) for heat pipe 2, is placed outside of the discharge gap. The cooling fins 11 are cooled with air 17 blown by fan 16.

In practical use, the number of the at least one ground electrode, the at least one insulating layer and the at least one high voltage electrode may be determined according to actual needs. The device according to the invention can be used for systems in which one or a plurality of gaps is used for the discharge. The at least one annular heat pipe allows to efficiently cool the at least one discharge gap. Additional cooling with water is not required. The use of an annular heat pipe leads to significant design advantages; the reaction zone does not need to be cooled directly, a cooling medium and pumping systems are not necessary, the cooling section can be placed in proximity to the discharge gap. The systems are therefore much smaller and can be developed as "plug and play" solutions.

Preferably, a heat exchanger with a cooling jacket is arranged in the condensation zone of the heat pipe. This allows transfer of the heat generated by the heat pipe to the cooling water of the heat exchanger. For larger systems with multiple high voltage electrodes it is advantageous, if an interlocking connection between the cooling jacket of the heat exchanger and the heat pipe is used.

The heat pipe can but does not need to be made of an electrically conductive material. Therefore the components of the electrode arrangement, the high voltage electrodes, the ground electrodes and the even the dielectric can be designed as a heat pipe.

The present invention significantly improves the efficiency of ozone generators and the concentration of the ozone output. Heat balancing between areas of high and low temperature is possible, which results in less $NO_x$ generation because less power input per surface area is required.

The invention claimed is:

1. A device for generating ozone from oxygen-containing gas, the device comprising:
   an electrode arrangement comprising:
   at least one high-voltage electrode;
   at least one annular ground electrode;
   an annular dielectric arranged between the at least one high-voltage electrode and the at least one ground electrode, each of the at least one high-voltage electrode, the at least one annular ground electrode, and the annular dielectric comprising an electrode arrangement component, and
   one or more annular heat pipes defining, surrounding, or defining and surrounding the at least one high-voltage electrode, and surrounded by at least one other electrode arrangement component, each of the one or more annular heat pipes comprising an annular space in cross section defined by radially spaced walls, the annular space containing a condensable heat transfer medium, the heat pipe comprising an evaporator section and a condensation zone, the heat pipe configured for vaporization of the heat transfer medium in the evaporator section, condensation of vaporized heat transfer medium in the condensation zone, and return of condensed heat transfer medium to the evaporator section.

2. The device of claim 1, wherein one or more of the at least one high-voltage electrode, the at least one ground electrode, and the annular dielectric comprise the one or more annular heat pipes.

3. The device of claim 2, wherein the at least one high-voltage electrode includes a central high-voltage electrode, the high-voltage electrode comprising a metal heat pipe having a circular cross-section and defining an enclosed cavity.

4. The device of claim 3, wherein the metal heat pipe comprises a closed heat exchange system.

5. The device of claim 3, wherein each of the metal heat pipe and the one or more annular heat pipes comprises a closed heat exchange system.

6. The device of claim 2, wherein the at least one high-voltage electrode includes a central high-voltage electrode comprising a filler material arranged on a heat pipe, the heat pipe having a circular cross-section and defining an enclosed cavity.

7. The device of claim 6, wherein the heat pipe having the cylindrical cross section comprises a closed heat exchange system.

8. The device of claim 6, wherein at least one of the metal heat pipe and the one or more annular heat pipes comprises a closed heat exchange system.

9. The device of claim 6, wherein the heat pipe having the circular cross-section comprises an insulator.

10. The device of claim 6, wherein the filler material comprises a mesh or fabric comprising metal wire.

11. The device of claim 10, wherein the metal wire comprises stainless steel.

12. The device of claim 1, wherein at least one of the one or more annular heat pipes forms an electrode.

13. The device of claim 1, comprising:
at least a first discharge gap defined between the at least one high-voltage electrode and the annular dielectric;
at least a second discharge gap defined between the annular dielectric and the at least one ground electrode; and
wherein the at least one first discharge gap and the at least one second discharge gap are configured to be traversed by the oxygen-containing gas.

14. The device of claim 1, comprising four discharge gaps configured to be traversed by the oxygen-containing gas, wherein the at least one high-voltage electrode defines a heat pipe defining an enclosed cavity and the at least one annular ground electrode defines an annular heat pipe of the one or more annular heat pipes.

15. The device of claim 1, wherein at least one of the one or more annular heat pipes is a component of a heat exchange system having an air-cooled finned condenser.

16. The device of claim 1, further comprising a heat exchanger arranged in the condensation zone, the heat exchanger connected to the at least one annular heat pipe.

17. The device of claim 1, wherein at least one of the one or more annular heat pipes comprises a closed heat exchange system.

18. The device of claim 17, wherein each of the one or more annular heat pipes comprises a closed heat exchange system.

19. The device of claim 1, wherein the electrode arrangement is configured to produce silent electric discharges suitable to generate ozone from the oxygen-containing gas.

* * * * *